United States Patent
Wellstood et al.

(10) Patent No.: US 7,268,542 B1
(45) Date of Patent: Sep. 11, 2007

(54) SCANNING SQUID MICROSCOPE HAVING POSITION NOISE COMPENSATION

(75) Inventors: Frederick C. Wellstood, Fairfax, VA (US); Su-Young Lee, Berlin (DE); John Matthews, Greenbelt, MD (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 399 days.

(21) Appl. No.: 11/081,361

(22) Filed: Feb. 16, 2005

Related U.S. Application Data

(60) Provisional application No. 60/545,918, filed on Feb. 20, 2004.

(51) Int. Cl.
*G01R 33/035* (2006.01)
(52) U.S. Cl. .................... 324/248; 326/5; 505/162; 505/846
(58) Field of Classification Search ............... 324/248; 327/527; 326/5; 600/409; 505/162, 846
See application file for complete search history.

(56) References Cited

U.S. PATENT DOCUMENTS 5,523,686 A * 6/1996 Kirtley et al. ............. 324/248

6,489,611 B1   12/2002 Aumond

OTHER PUBLICATIONS

Su-Young Lee, J. Matthews, F.C. Wellstood; Position noise in scanning superconducting quantum interference device microscopy, Applied Physics Ltrs, vol. 84, No. 24, Jun. 14, 2004.

* cited by examiner

*Primary Examiner*—Bot LeDynh
(74) *Attorney, Agent, or Firm*—AFMCLO/JAZ; Robert V. Klouzinski; Jeffrey R. Moore

(57) ABSTRACT

A scanning SQUID microscope is set forth to provide improved output imaging. The SQUID microscope includes a vertically adjustable housing adapted to securely retain a SQUID loop or sensor. A scanning stage of the SQUID microscope is adapted to support a sample while moving the sample along a predetermined path to selectively position predetermined portions of the sample in close proximity to the SQUID loop or sensor to permit the loop or sensor to detect predetermined magnetic field information provided by the predetermined portions of the sample. A position control processor coupled to the scanning stage is operative to receive and process the predetermined magnetic field information to provide corresponding position noise information. Criteria are also presented for determining the expected level of position noise under given experimental conditions.

5 Claims, 7 Drawing Sheets

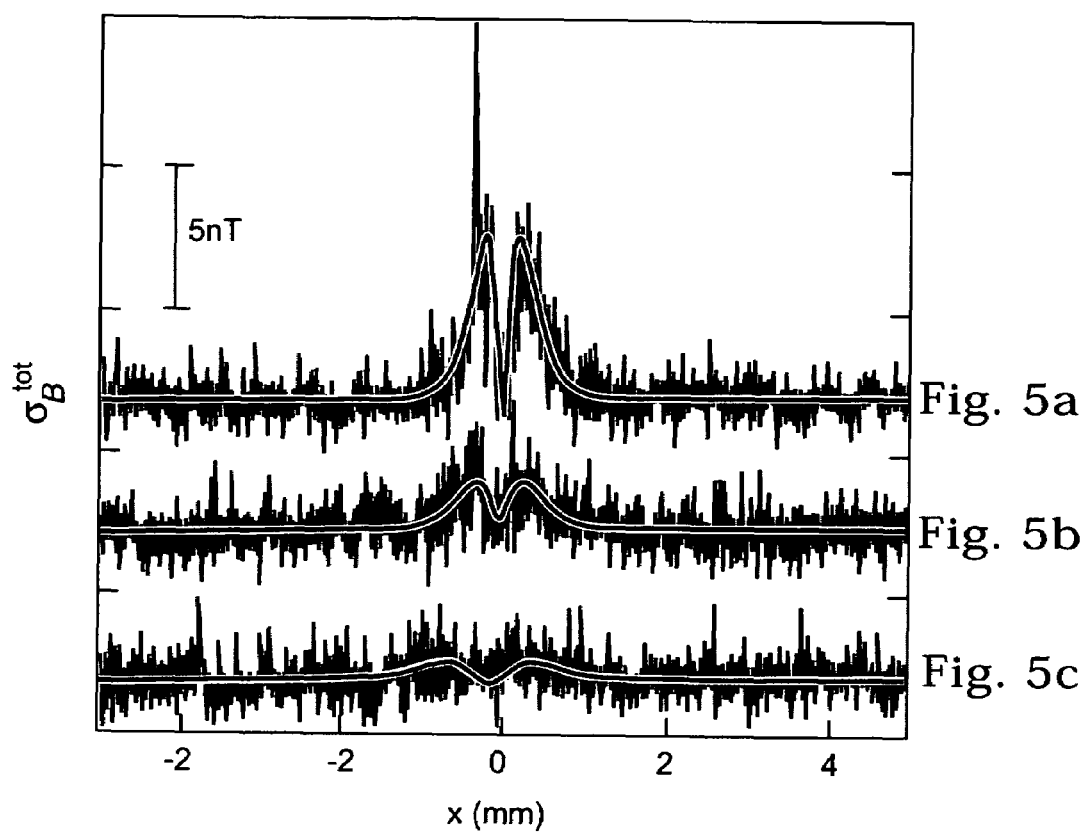

SCANNING SQUID MICROSCOPE HAVING POSITION NOISE COMPENSATION

CROSS-REFERENCE TO RELATED APPLICATIONS

This application claims priority under 35 U.S.C. § 119(e) to U.S. Provisional Patent Application No. 60/545,918 entitled "Position Noise in Scanning SQUID Microscopy," filed on Feb. 20, 2004, which is incorporated herein by reference in its entirety.

BACKGROUND OF THE INVENTION

As is known, in scanning SQUID microscopy a Superconducting Quantum Interference Device (SQUID), which is incorporated into a Scanning SQUID Microscope, is used to obtain a magnetic field image of a sample. By scanning very close to the surface of the sample, good spatial resolution can be obtained in the resulting image. Recent research on room-temperature SQUID microscopy (the sample is at room temperature) has focused on improving the spatial resolution achieved under typical operating conditions either through hardware or software improvements. For example, using a magnetic inverse transformation, it is possible to transform a magnetic image into an image of the source currents. The spatial resolution of the resulting current density image can be up to ten times (10×) better than the raw magnetic field image or up to 5 times smaller than the SQUID-sample separation z under typical conditions, limited by the strength of the magnetic signal and the noise in the SQUID. This result is only possible because the data from a SQUID is quantitatively very precise and accurate, allowing a complicated transformation to be reliably performed without introducing significant distortion.

One drawback of the scanning SQUID microscope is that scanning very close to the surface of the sample to obtain good spatial resolution, as described above, also undesirably introduces position noise into the magnetic field data and results in distortion or other degradation of the subsequently formed images thereof. It has been further determined that even quite small amounts of position noise introduced to the magnetic field data during scanning can significantly degrade the subsequently formed images.

It would, therefore, be desirable to overcome the aforesaid and other disadvantages.

BRIEF SUMMARY OF THE INVENTION

A scanning SQUID microscope is set forth to provide improved output imaging of a sample under investigation, such as a semiconductor circuit chip, micro electromechanical device (MEM) and the like. The microscope includes a scanning stage adapted to retain the sample. A high resolution position encoder is coupled to the scanning stage. A position control processor is coupled to the position encoder and is operative to receive and process an output signal from the position encoder for controlling the scanning stage trajectory. The position control processor is further operative for triggering acquisition of a number of samples of magnetic field data at one or more predetermined locations of the sample. The position control processor may also average the number of samples of magnetic field data to provide average magnetic field data at the one or more predetermined locations of the sample. The average magnetic field data includes reduce position noise, which may be introduced to each of the number of samples of magnetic field data by slight positioning errors associated with the position encoder and/or other various positioning devices of the microscope. The average magnetic field data having the reduced position noise may be processed by the position control processor or other processing system, such as a computer, to provide the improved output imaging.

In another aspect, a method of operating a scanning SQUID microscope to provide improved output imaging is set forth. The method includes retaining a sample on a moveable scanning stage associated with the microscope. The scanning stage is controlled using a position encoder to move the sample to a first predetermined location in close proximity to a sensor located on the microscope. A number of scans of the sample at the first predetermined location may be executed for acquiring a number of scans of magnetic field data. The number of scans of magnetic field data obtained at the first predetermined location may be averaged for providing average magnetic field data having reduced position, which may be due to position errors generated by the position encoder while controlling the movement of the sample to the first predetermined location in close proximity to the sensor. The above described method may be repeated a number of times at a number of predetermined locations of the sample to provide a number of improved images thereof in accordance with the present invention.

BRIEF DESCRIPTION OF THE DRAWINGS

The foregoing features of this invention, as well as the invention itself, may be more fully understood from the following description of the drawings in which:

FIG. 3 (b) shows 2D gray scale image having magnetic field noise with $\sigma_x$=0.5 μm;

FIG. 3 (c) shows a cross section through FIG. 3 (b);

FIG. 3 (d) shows a measured image having magnetic field noise with position noise (difference between measured magnetic field and fitted magnetic field);

FIGS. 5 (a), 5(b) and 5(c) show a measured $\sigma_{B_j}^{tot}$ for I=4.8 mA and respective z=354 μm, z=514 μm, and z=858 μm, where the curves of FIGS. 5 (a) and 5(b) have been offset by 10 nT, and 5 nT respectively for clarity and where the respective curves of FIGS. 5 (a), 5(b) and 5(c) were made by taking the standard deviation of five (5) neighboring data points of the difference between the measured magnetic field and fitted magnetic field and where open circles indicate fitted data using Eq. 5;

DETAILED DESCRIPTION OF THE INVENTION

In scanning SQUID microscopy, magnetic images are acquired by raster scanning a sample close to a SQUID sensor retained on a SQUID microscope, as will be described in detail below, while recording the output from the SQUID. One example of a scanning SQUID microscope may be obtained from U.S. Patent Application Publication No. U.S.2004/0051524, entitled, "SCANNING SQUID MICROSCOPE WITH IMPROVED SPATIAL RESOLUTION," published Mar. 18, 2004, the subject matter of which is hereby incorporated by reference in its entirety.

The position of the sample with respect to the SQUID is controlled by a computer that is linked to motors that drive a scanning stage. The position of the stage is usually determined by position encoders. Stage jitter, encoder uncertainty and environmental vibrations cause random errors in the position at which the data is recorded, which ultimately contributes to significantly degraded magnetic images. Accordingly, the present invention provides a scanning SQUID microscope including a position control processor that is adapted to determine the random errors in the position at which the data is recorded for improving magnetic images subsequently generated from the data, as will be described in further detail below.

Figure 1:
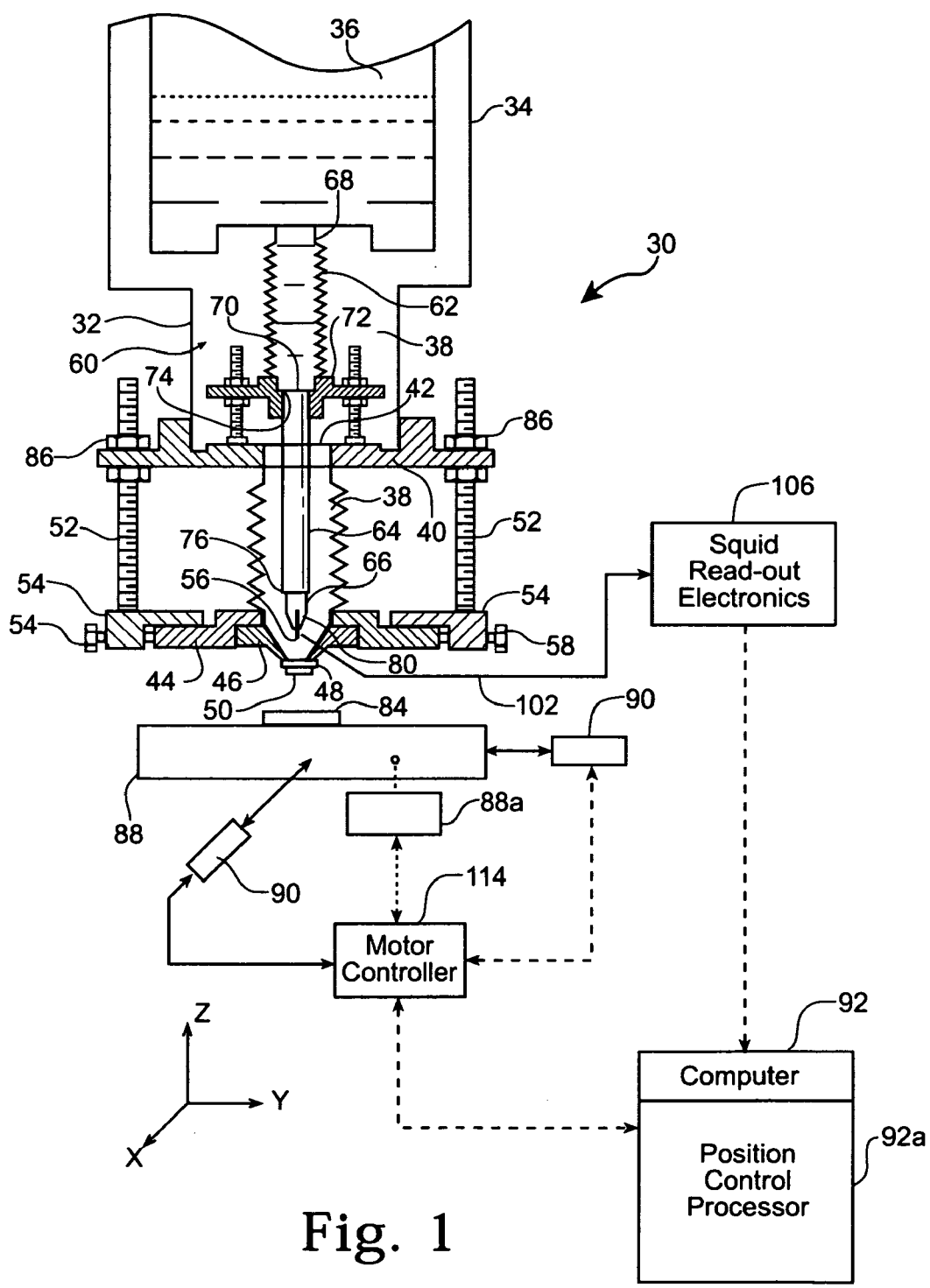
FIG. 1 shows a scanning SQUID microscope including the position control processor having features of the present invention.

Referring now to FIG. 1, an exemplary scanning SQUID microscope 30 of the present invention includes a housing 32 which accommodates a cryogen containing portion 34 for receiving and holding liquid nitrogen 36, or any other cryogenic medium, as well as a vacuum space 38 which thermally insulates the cryogen containing portion 34 from room temperature. The housing 32 thus is a modified dewar assembly having the vacuum space 38 maintained at about 0.00010 Torr. The housing 32 includes an annular plate 40 having a circular opening 42 located substantially in the center thereof. Spaced from the annular plate 40, is a window support 44 which supports a plastic flange 46 to the end of which a sapphire window support 48 is secured having an annular opening in which a transparent and thin window 50 is attached. The window 50 is preferably formed of sapphire and is approximately 25 microns thick.

The annular plate 40 is connected via three threaded rods 52 (only two of which are shown in FIG. 1) to a horizontal adjustment annular disk 54 to allow movement of the window 50 with respect to SQUID sensor 56. The adjustment screws 58 protrude through sides of the annular disk 54 to permit the movement of the window support 44 with respect to the annular disk 54 for alignment with the window 50 with respect to the SQUID sensor 56.

A flexible bellows tube 60 for delivery cryogen extends centrally and longitudinally within the housing 32 and includes stainless steel bellows 62 copper or brass tube 64 and a thermally conducting rod preferably forming a sapphire tip 66. The stainless steel bellows 62 is in open communication at the end 68 with the cryogen containing portion 34 of the housing 32. The end 70 of the bellows 62 is located in the vacuum space 38 and is mounted on the top of interior flange of a grommet 72. The end 74 of the tube 64 is seated and soldered on the bottom of the interior flange of the grommet 72 and thus is in open communication with the stainless steel bellows 62. The tube 64 extends through the vacuum space 38 of the housing 32 and further through the opening 42 in the annular plate 40. Located in the second end 76 of the tube 64 and fastened thereto with epoxy is the sapphire tip 66 which serves as a thermally conducting substrate for the SQUID chip 56. The end 80 of the sapphire tip 66, is fabricated with a flat or planar side surface 82 extending in parallel to the longitudinal axis of the sapphire tip 66. The SQUID chip 56 is adhesively attached to the flat side surface 82 and is securely maintained thereon during the operation of the scanning SQUID microscope 30.

The cryogenic medium 36 from the cryogen containing portion 34 is supplied to the sapphire tip 66 through the stainless steel bellows 62 and the tube 64 to permit heat exchange between the SQUID chip and the liquid nitrogen.

The distance between the SQUID chip and the window 50 may be as great as 2-3 millimeters or they may be contiguous in relation to each other. The construction of the scanning SQUID microscope 30 permits maintenance of the SQUID chip temperature at 77.degree. K while allowing for minute separation between the SQUID chip 56 and a room temperature sample 84, also referred herein as the object under investigation.

When the cryogenic liquid passes through the stainless steel bellows 62, and the copper tube 64 these elements may contract. However, such deformation will not prevent the position of the sapphire tip 66, nor the SQUID chip 56 from being close to the window, due to the fact that the window position can be vertically adjusted by means of the adjustment nuts 86.

The sample 84 is positioned outside of the housing 32 of the scanning SQUID microscope 30 on a scanning stage 88, which is capable of movement in the three mutually perpendicular directions X, Y and Z. Preferably, the stage is motorized and provides positioning accuracy of about one micron or better. The scanning stage 88 is moved by the stepper motors 90 for driving the stage 88 in X and Y directions. It is preferable to mount the motors 90 as far as possible from the SQUID sensor (about 50 cm) and to envelop them in an eddy-current magnetic shield in order to shield the SQUID sensor from undesirable magnetic fields produced by the motors 90.

Preferably, a computer or processor 92 with controlling software and peripherals for operating the motors is used to operate the scanning stage 88 in the scanning SQUID microscope of the present invention. In accordance with the present invention, the computer or processor 92 includes a scanning stage position control processor 92a which both controls the trajectory of the scanning stage 88, and triggers the acquisition of magnetic field data at predetermined positions. The operation of the position control processor will be described in further detail below in connection with FIGS. 2-7.

In FIG. 1, when setting up the microscope for imaging, the window 50 and the end 104 of the substrate 96 are aligned by moving the window 50 by means of the adjusting nuts 86 or screws 58. Once the window 50 is leveled with respect to the SQUID chip 56, the sample 84 on the scanning stage 88 is leveled with respect to the window 50 to insure that the separation between the sample and the SQUID sensor does not change during the scan as well as for achieving a small separation between the sample and the SQUID sensor. This operation is performed by moving the stage 88 in the Z direction shown in FIG. 1, either manually or automatically under the control of the computer 92. This operation is known to those skilled in the art and is not intended to be discussed in detail herein.

To obtain an image of the physical properties of the sample 84, individual raster scan lines are acquired by scanning the sample with the SQUID sensor in, for example, the X direction while simultaneously recording in the computer 92 the X coordinates (read from the motor-control board 114) and the relevant magnetic field measured (read from the SQUID read-out electronics 106). The process is further repeated for the sequence of Y values, by scanning the sample in the Y direction to construct a 2-dimensional image of the surface of the sample 84.

During the acquisition of the images of physical properties of the sample 84, the position of the scanning stage 88 is determined by reading positions of the stepper motors 90. The control program of the computer 92 can read the stepper motor positions directly from a motor controller board 114 which may be mounted in the computer 92. Simultaneously, the read-out electronics 106 acquires data from the SQUID sensor 98. Additional fine positioning of the scanning stage 88 is determined by reading position signals from the high resolution encoder 88a, which is coupled between the scanning stage 88 and motor controller board 114.

Both the SQUID output and the position of the stage 88 are converted into digital form and recorded in the computer 92. Once data has been acquired using a control program of the computer 92, it is converted into an image. In its raw form, the image data consists of a set of N line scans (Y values) intersected with M line scans (X values), with one or more associated magnetic field values at each of the N×M points. To provide an image, the data is first spatially regularized, i.e., linearly interpolated into rectangular space grids. Then an image rendering program is used to assign a level of gray to each grid point. The image rendering program is well-known in the art and is not discussed in further detail. The control program processes the received position signals from the motor controller 114, in synchronism with outputs of SQUID sensor read by the read-out electronics 106 and derives therefrom the spatially resolved images of the physical properties of the object, such as for example magnetic fields emanating from the surface of the sample 84, etc.

In accordance with an embodiment of the present invention, for a scan along the x-direction, if the recorded position of the i-th pixel is $x_i$, then the position control processor determines that actual position of the i-th pixel will be:

$$x_i' = x_i \pm \delta x_i \quad (1)$$

where $\delta x_i$ is the error in the recorded position of the i-th pixel. It is assumed that $\delta x_i$ is uncorrelated and distributed randomly with standard deviation $\sigma_x$. For simplicity, it is assumed that the only position error is along the scan direction x and that $\sigma_x$ does not depend on position. For convenience, $\sigma_x$ may be expressed as an effective r.m.s. uncertainty in the magnetic field:

$$\sigma_{B_i} = \left|\frac{\partial B_x}{\partial x}\right|_{x=x_i} \sigma_x \quad (2)$$

where $\partial B_x/\partial x|_{x=x_i}$ is the derivative of the magnetic field B in the x direction at $x=x_i$. Including the random magnetic field noise $\sigma_B$ from the SQUID sensor itself, the total effective r.m.s. magnetic field noise in the i-th pixel is, $$\sigma_{B_i}^{Tot} = \sqrt{\sigma_{B_i}^2 + \sigma_B^2} = \sqrt{\left|\frac{\partial B}{\partial x}\right|_{x=x_i}^2 \sigma_x^2 + \sigma_B^2} \quad (3)$$

Figure 2:
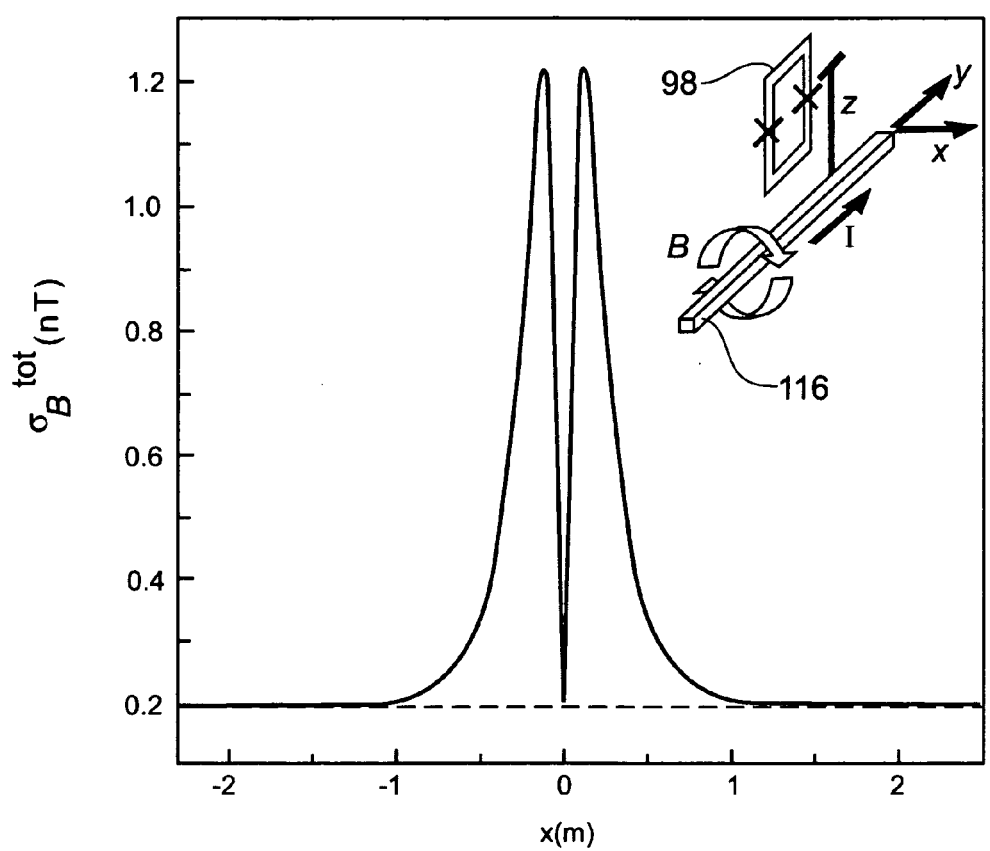
FIG. 2 shows predicted total effective field noise from Eq. (4), including both position noise and intrinsic x-SQUID noise, with I=2.3 mA, $\sigma_B$=0.2 nT, z=250 μm, $\sigma_x$=0.5 μm; whereby the dotted line indicates intrinsic SQUID noise level, $\sigma_B$=0.2 nT; and the SQUID sensor is oriented to have an x-SQUID configuration.

As an example and as shown in FIG. 2, Eq. (3) can be evaluated for the case of a straight wire 116 which carries current I along the y-axis. It should be understood that a straight wire 116 is described for exemplary purposes and that similar characteristics may be associated with wires having other geometries and/or configurations and that the straight or other wires may be included in the sample 84 (FIG. 1), which may be scanned by the scanning SQUID microscope 30 of the present invention. In FIG. 2, with the SQUID loop or sensor 98 oriented to detect the x-component of the magnetic field (an x-SQUID configuration), then $$B_x = \frac{\mu_0 I}{2\pi} \frac{z}{x^2 + z^2}, \quad (4)$$

where z is the distance between the center of the SQUID loop 98 and the x-y plane. Substituting into Eq. (3), we find:

$$\sigma_{B_i}^{Tot} = \sqrt{\left(\frac{\mu_0 I}{2\pi} \frac{2xz}{(x^2+z^2)^2} \sigma_x\right)^2 + \sigma_B^2} \quad (5)$$

FIG. 2 further shows $\sigma^{Tot}_{Bi}$ calculated for typical parameters I=2.3 mA, $\sigma_B$=0.2 nT, z=250 µm, and $\sigma_x$=0.5 µm. The noise is a maximum to both sides of the wire 116, where the derivative of the field is a maximum. Thus, an insidious feature of the position noise is that its existence tends to be hidden in an image because it is only significant where there is a strong signal, yet it delivers its effect at the worst place, i.e. where the signal is located. This behavior is somewhat analogous to the role of current noise in determining the total voltage noise when an amplifier is connected to a source with resistance R=∂V/∂I; the effect of current noise is only observable when a non-zero impedance R is connected across the amplifier input. The peak r.m.s. noise of 1.2 nT in FIG. 2 is about 6 times larger than that due to the intrinsic SQUID noise $\sigma_B$=0.2 nT (dashed line in FIG. 2).

Figures 3A, 3B, 3C, 3D:
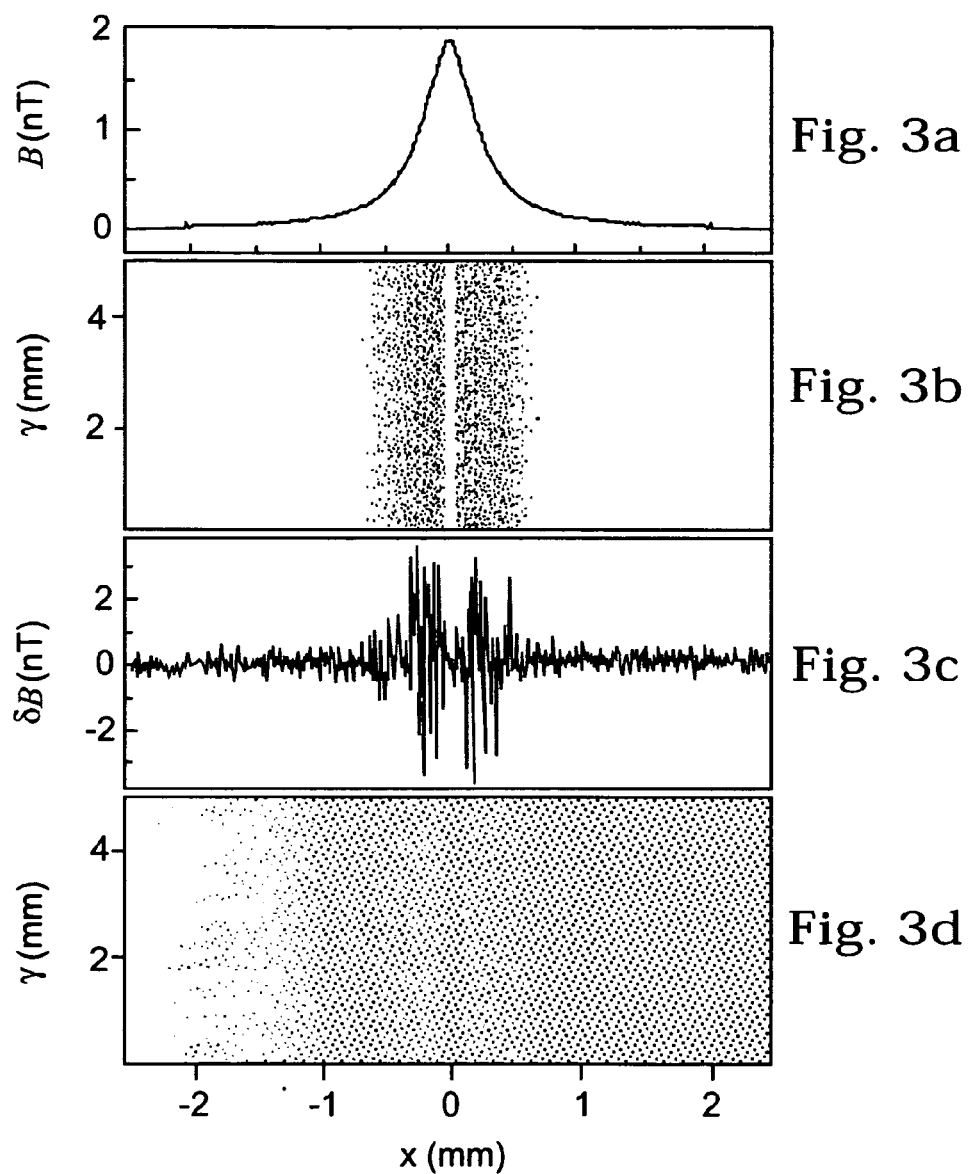
FIG. 3 (a) shows calculated magnetic field from a wire with Gaussian noise distribution with $\sigma_B$=0.2 nT, and I=2.3 mA at z=250 μm.

For comparison, FIG. 3(a) shows $B_x$ calculated for a wire carrying 2.3 mA at z=250 µm, FIG. 3(b) shows an image of the difference between the field with and without noise, while FIG. 3(c) shows a line section through FIG. 3(b). After the field from the wire is subtracted away [FIG. 3(b)], the noise become clear. FIG. 3(d) shows the corresponding difference between a measured field from wire and theory for a real scan, as described below.

Examination of Eq. 5 reveals that at $x=\pm z/\sqrt{3}$ the effective field noise near a wire is a maximum, $$\sigma_B^{max} = \sigma_B \sqrt{\left(\frac{3\sqrt{3}\,\mu_0 I \sigma_x}{16\pi z^2 \sigma_B}\right)^2 + 1} = \sigma_B \sqrt{\left(\frac{z_0}{z}\right)^4 + 1} \quad (6)$$

where we define a new parameter, $z_0 \equiv \sqrt{3\sqrt{2}\mu_0 I \sigma_x/(16\pi\sigma_B)}$. For z<<$z_0$, the effect of position noise will dominate, while for z>>$z_0$, the true magnetic noise $\sigma_B$ becomes dominant. In addition, as z is reduced below $z_0$, we see from Eq. 6 that the effect of position noise increases rapidly. For I=2.3 mA, $\sigma_B$=0.2 nT and $\sigma_x$=0.5 µm, we obtain $z_0$=864.3 µm, which is remarkably large compared to typical scanning separations. This implies that position noise is the dominant source of noise for typical situations in scanning SQUID microscopy, rather than the magnetic noise from the SQUID.

The high-$T_c$ SQUID microscope 30 (FIG. 1) of the present invention is operated at 77 K and is read out using a 256 kHz flux-locked feedback loop. In an embodiment, a 256 kHz flux-locked feedback loop can be obtained from Star-cryoelectronics of Santa Fe, N. Mex. The effective dimensions of the YBCO bicrystal dc SQUID are 25 µm×5.5 µm and the SQUID chip 56 (FIG. 1) is oriented vertically (x-SQUID configuration). The bottom of the SQUID loop 98 (schematically represented in FIG. 2 and carried on the SQUID chip 56 of FIG. 1) is approximately 200 µm from the bottom of the SQUID chip 56, which limited the sensor-sample separation. The sensitivity of the system is about 20 $\mu\Phi_0/Hz^{1/2}$ above 1 kHz. The sample 84 (FIG. 1) positioning is provided by the motor controller 114 (FIG. 1), which in the present embodiment includes a Newport ESP 6000 motor controller and TSP 150 x-y stage, which may be obtained from Newport Corp. of Irvine Calif. This scanning stage 88 has a 15 cm scan range and nominal position resolution of 0.1 µm.

The scanning stage 88 contains a position encoder 88a (e.g., optical or electro-mechanical position detector), which is used by the motor controller 114 and the position control processor 92a to control the position and velocity of the scanning stage 88 throughout the measurement. In addition, collection of magnetic field data via the SQUID read out electronics 106 is triggered by the position read out from the encoder 88a, e.g. for a scan between x=20.0 mm and 20.5 mm with position steps of 0.1 mm, magnetic field data would be acquired when the position encoder 88a reads 20.0, 20.1, 20.2, 20.3, 20.4, and 20.5 mm. Although not shown, it should be understood that a data acquisition card located in the computer 92 may also be used to collect magnetic field data in lieu of the readout electronics 106.

The position of the stage 88 should be continually read using the encoder throughout the scan. If the encoder 88a is only read at the beginning and/or end of the scan, then the magnetic field data should be acquired by time triggering. This involves knowledge of the trajectory of the scanning stage 88 during the scan (velocity, acceleration). Uncertainties in trajectory parameters will typically lead to much larger, accumulated, deviation in the position from its expected value, and hence a significantly larger position noise.

In an exemplary measurement of the position noise in the system 30, the sample 84 was provided to include a 40-gauge (89 µm diameter) copper wire carrying 5 mA of current. This 40-gauge wire sample was aligned and scanned along the y-direction. A 1 cm scan in the x-direction with a step size Delta-x=5 µm was also taken.

The resulting data from the 40-gauge wire sample was fit to the expected magnetic field from the straight wire 116. For accurate fitting, the effect of the SQUID loop 98 area should be considered, and any allowance made for tilt of the SQUID loop 98. Strictly speaking, the SQUID loop or sensor 98 (FIG. 2 and carried on the SQUID chip 56 of FIG. 1) does not measure the field at a point, but rather the average field over the area of the SQUID loop 98. For an x-SQUID with a loop of width w and height h, the average field is $$\langle B_x \rangle = \frac{1}{wh} \int_{z-h/2}^{z+h/2} \int_0^w \frac{\mu_0 I}{2\pi} \frac{z'}{x^2 + z'^2} dz' dy = \frac{\mu_0 I}{4\pi h} \ln\left(\frac{x^2 + (z+h/2)^2}{x^2 + (z-h/2)^2}\right) \quad (9)$$

Secondly, since the alignment between the wire and the SQUID is not perfect, an allowance should be made for some coupling of the z-component of the magnetic field (there is no y-component for a straight wire running along the y-axis). Including the tilt θ of the SQUID sensor 98 (FIG. 2) from the perpendicular, the expected response of the x-SQUID will be, $$\langle B_x \rangle = \frac{\mu_0 I}{4\pi h} \ln\left(\frac{x^2 + (z + h\cos\theta/2)^2}{x^2 + (z - h\cos\theta/2)^2} \frac{(x - h\sin\theta/2)^2 + z^2}{(x + h\sin\theta/2)^2 + z^2}\right) \quad (10)$$

Figure 4A:
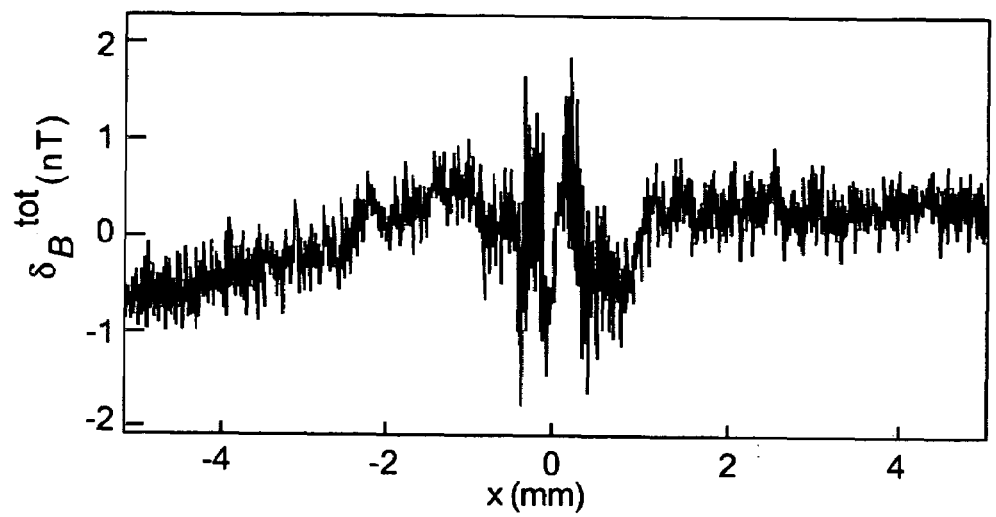
FIG. 4 shows a difference between measured magnetic field and fitted magnetic field for a wire carrying I=4.8 mA at (a) z=354 μm, and (b) z=858 μm.

From fits to the data, it should be determined that θ=0.64° and h≅50 µm. The difference between the data and the fit reveals the total field noise, as shown in FIGS. 4a and 4b.

Figure 4B:
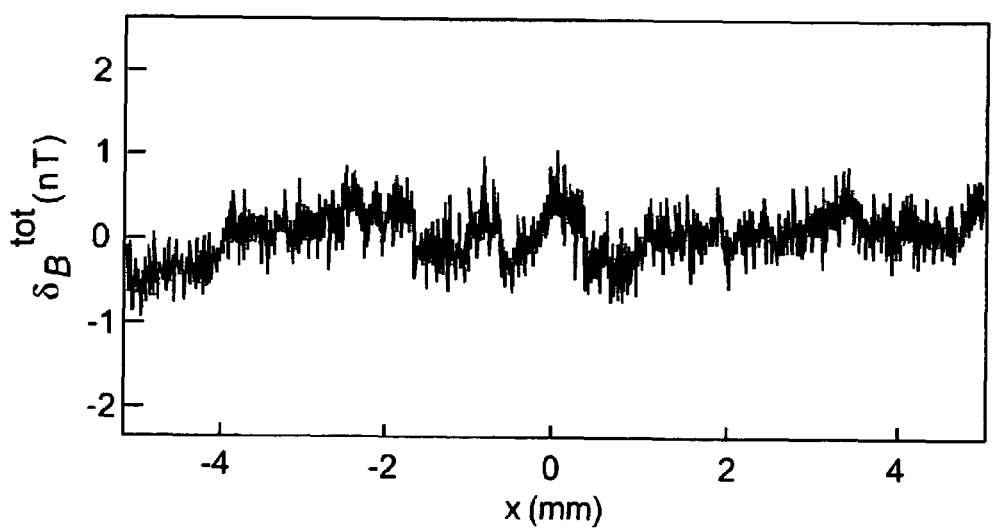

In FIG. 4(b), it should be understood that for z=858 µm the noise level does not depend on position, and any effect from position noise cannot be distinguished. However in FIG. 4(a), it should be understood that for z=354 µm, the position noise is obvious near x=0. It should be noted that there may be some residual drift evident in the difference, which is probably due to a small systematic error in the fit. To eliminate this in a model independent way, and locally determine $\sigma_{B_i}^{tot}$, the data is further analyzed by computing at each point the standard deviation of the neighboring 5 data points.

FIGS. 5a, 5b, and 5c, respectively show the position noise for z=354 µm, 514 µm and 858 µm. By fitting the position noise data, as represented in FIGS. 5a, 5b, and 5c using Eq. 5, values of $\sigma_B$=0.185 nT and $\sigma_x$=0.145 µm may be obtained (See solid lines in FIGS. 5a, 5b, and 5c). From I, $\sigma_x$, and $\sigma_B$, $z_0$=700Vm may be obtained.

FIG. 5(c), shows that when z>>$z_0$, the position noise is buried by the intrinsic SQUID noise. The measured $\sigma_x$ is somewhat larger than the nominal encoder 88a resolution of 0.1 µm and that $\sigma_B$ is reasonable for the scanning SQUID microscope 30 of the present invention.

The presence of position noise has an important implication for the design of scanning SQUID microscopes 30 or other magnetic imaging systems. From Eq. (6), the criterion $$\sigma_x \leq \sigma_B \left(\frac{16\pi z^2}{3\sqrt{3}\mu_0 I}\right) \quad (11)$$

will guarantee that the effect of position noise is no larger than the intrinsic magnetic noise $\sigma_B$ when imaging a wire 98 carrying current I at distance z. For example, if $\sigma_B$=0.185 nT, I=500 µA, and z=150 µm, then Eq. (11) implies that we need $\sigma_x$<62 nm. This is a remarkably strict requirement on the positioning, largely due to the very low noise in the SQUID compared to the signal strength. Use of a larger current, a smaller separation or a more sensitive SQUID would necessitate an even tighter requirement in positioning.

The position noise may be reduced by averaging several scans. In an embodiment, 70 scans of the SQUID sensor 98 (FIG. 2) my be executed in the x-direction at the same y position for the straight wire along the y-direction.

Figure 6:
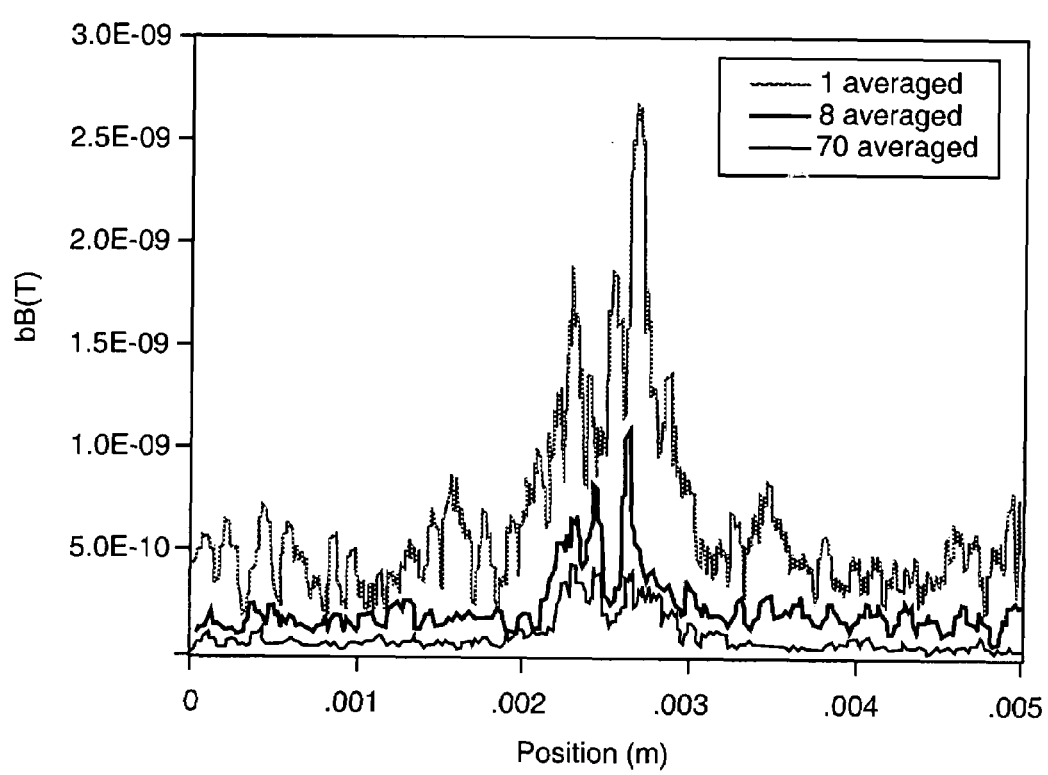
FIG. 6 shows measured magnetic field noise $\sigma_{B_j}^{tot}$ for I=2.32 mA and z=250 μm with averaging 1, 8, and 70 scans.
Figure 7A:
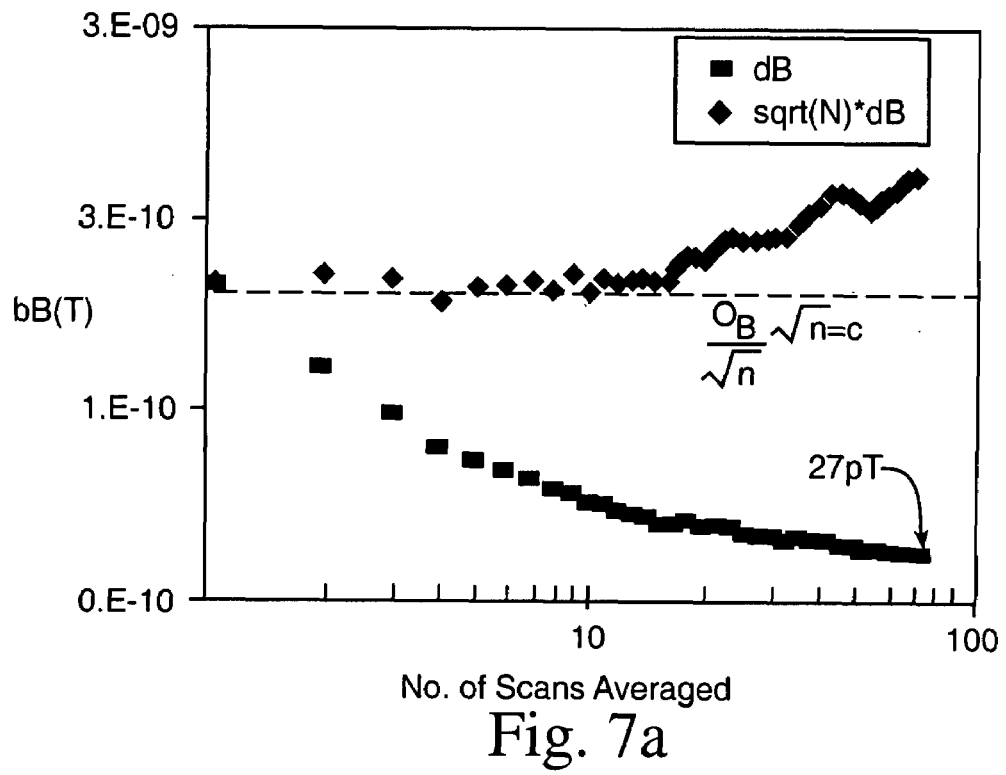
FIG. 7(a) shows a relation between r.m.s. magnetic field noise and number of scans averaged.
Figure 7B:
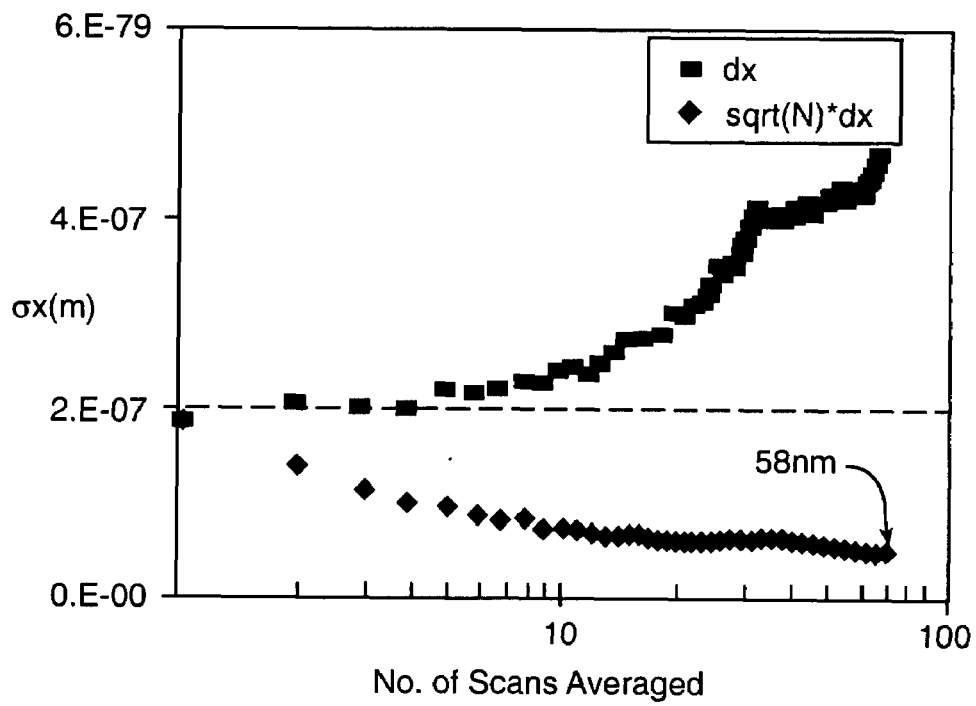
FIG. 7 (b) shows a relation between r.m.s. position noise and number scans averaged, which may be obtained by fitting magnetic field noise of FIG. 6 into Eq.5.

FIG. 6 shows that both the magnetic field noise from intrinsic SQUID sensor 98 noise and the position noise are reduced by averaging scans. By fitting these measured magnetic field noises into Eq. 5, the relation between $\sigma_B$ (FIG. 7(a)) and $\sigma_x$ (FIG. 7(b)) can be obtained, as well as the number of scans averaged. If the noise is random, the noise will be reduced by a factor of $N^{1/2}$, where N is the number of scans. Therefore, the random noise multiplied by $N^{1/2}$ is expected to remain constant. As shown in FIG. 7(a) and FIG. 7 (b), the intrinsic noise multiplied by $N^{1/2}$ keeps constant until 10 scans are averaged, but it increases after the 10 scans are averaged. In case of position noise, the increase starts earlier. This means that the source of both noises meet a limit. The source of the limit for the intrinsic SQUID noise may be the SQUID electronics. The source of the limit for the position noise may be the encoder 88a resolution of the stage 88 (FIG. 1), which is approximately 100 nm.

The above results for an x-SQUID image of an infinite wire can be readily extended to other samples and SQUID arrangements. Table I below summarizes the positioning requirement for some other common cases.

Table I. Provides magnetic field and position noise limits for different sample and SQUID configurations; d is the distance between the two coils of a gradiometer, m is magnetic moment (m=I·area), c=1.27, $\lambda$ is the magnetic penetration depth in a superconductor, and Delta-1 is the length of a short current carrying wire. The last column gives value that $\sigma_x$ must not exceed.

Alternatively, for a fixed sample-to-sensor separation z, the criteria can be used to determine the maximum position encoder resolution $\sigma_x$ for which position noise will not be the dominant source of noise in the measurement. It should be understood, that the smaller the SQUID sensor 98 to sample separation, the greater the effect of position noise is on the total effective magnetic field noise. Furthermore, it should be understood that the above results are not unique to SQUID sensors 98 and analogous results may arise for other similar raster scan imaging systems using other similar types of sensors.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A scanning SQUID microscope adapted to provide improved output imaging, comprising:

a scanning stage adapted to retain a sample;

a high resolution position encoder coupled to the scanning stage; and

| SQUID configuration | Sample | Magnetic signal | $\square_x$ criteria |
|---|---|---|---|
| x-SQUID | infinite wire | $\dfrac{\mu_0 I}{2\pi} \dfrac{z}{x^2 + z^2}$ | $\sigma_B \left( \dfrac{16\pi z^2}{3\sqrt{3}\,\mu_0 I} \right)$ |
| z-SQUID | infinite wire | $\dfrac{\mu_0 I}{2\pi} \dfrac{x}{x^2 + z^2}$ | $\sigma_B \left( \dfrac{2\pi z^2}{\mu_0 I} \right)$ |
| x-gradiometer | infinite wire | $\dfrac{\mu_0 I}{\pi} \dfrac{xz}{(x^2 + z^2)^2}$ | $\sigma_B \left( \dfrac{4\sqrt{2}\,\pi z^3}{\mu_0 I d} \right)$ |
| z-SQUID | magnetic dipole | $\dfrac{3\mu_0 I}{4\pi} \dfrac{yz}{(x^2 + y^2 + z^2)^{5/2}}$ | $\sigma_B \left( \dfrac{1372\sqrt{35}\,\pi z^4}{1875\,\mu_0 m} \right)$ |
| z-SQUID | magnetic flux line | $\dfrac{\Phi_0}{2\pi} \dfrac{z + c\lambda}{(x^2 + y^2 + (z + c\lambda)^2)^{3/2}}$ | $\sigma_B \left( \dfrac{50\sqrt{5}\,\pi(z + c\lambda)^3}{16\Phi} \right)$ |
| x-SQUID | short current segment | $\dfrac{\mu_0 I}{4\pi} \dfrac{z\Delta l}{(x^2 + y^2 + z^2)^{3/2}}$ | $\sigma_B \left( \dfrac{25\sqrt{5}\,\pi z^3}{12\,\mu_0 I \Delta l} \right)$ |

As set forth above, a system and process is provided for determining the effect of position noise on magnetic field images, which process may be used to determine the position noise in the scanning SQUID microscope 30 (FIG. 1). An averaging method is shown to reduce the position noise up to a fundamental limit, as can also be done for intrinsic magnetic field noise. Criteria are presented for determining, in this fundamental limit, the conditions under which position noise is expected to be the dominant source of noise in the measurement. These criteria may be interpreted in two ways. For a fixed position encoder resolution $\sigma_x$, the criteria set forth determine the sample-to-sensor separation z below which position noise will be the dominant source of noise.

a position control processor coupled to the position encoder and being operative to receive and process an output signal from the position encoder for controlling the scanning stage trajectory and for triggering acquisition of a number of samples of magnetic field data at one or more predetermined locations of the sample and averaging the number of samples of magnetic field data to provide average magnetic field data at the one or more predetermined locations of the sample and having reduce position noise operative to provide the improved output imaging.

2. A method of operating a scanning SQUID microscope to provide improved output imaging, comprising the steps of:
- retaining a sample on a moveable scanning stage associated with the microscope;
- controlling the scanning stage using a position encoder to move the sample to a first predetermined location in close proximity to a sensor located on the microscope;
- executing a number of scans of the sample at the first predetermined location for acquiring a number of scans of magnetic field data; and
- averaging the number of scans of magnetic field data obtained at the first predetermined location for providing average magnetic field data having reduced position due to position errors generated by the position encoder while controlling the movement of the sample to the first predetermined location in close proximity to the sensor.

3. The method of operating the scanning SQUID microscope of claim 2, further including processing the average magnetic field data associated with the first predetermined location of the sample to provide a first improved output image.

4. The method of operating the scanning SQUID microscope of claim 3, further including:
- controlling the scanning stage using the position encoder to move the sample to a next predetermined location in close proximity to the sensor;
- executing a number of scans of the sample at the next predetermined location for acquiring a number of scans of magnetic field data; and
- averaging the number of scans of magnetic field data obtained at the next predetermined location for providing average magnetic field data having reduced position noise due to position errors generated by the position encoder while controlling the movement of the sample to the next predetermined location in close proximity to the sensor.

5. The method of operating the scanning SQUID microscope of claim 4, further including processing the average magnetic field data associated with the next predetermined location of the sample to provide a next improved output image.

* * * * *